United States Patent
Iyer et al.

(10) Patent No.: US 9,319,037 B2
(45) Date of Patent: Apr. 19, 2016

(54) SELF-ADJUSTING CLOCK DOUBLER AND INTEGRATED CIRCUIT CLOCK DISTRIBUTION SYSTEM USING SAME

(71) Applicant: Advanced Micro Devices, Inc., Sunnyvale, CA (US)

(72) Inventors: Arun Sundaresan Iyer, Bangalore (IN); Alok Baluni, Bangalore (IN); Samuel Naffziger, Fort Collins, CO (US); Sriram Sambamurthy, Austin, TX (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 108 days.

(21) Appl. No.: 14/171,469

(22) Filed: Feb. 3, 2014

(65) Prior Publication Data
US 2015/0222277 A1    Aug. 6, 2015

(51) Int. Cl.
*H03B 19/00* (2006.01)
*H03K 5/13* (2014.01)
*H03K 5/00* (2006.01)

(52) U.S. Cl.
CPC ...... *H03K 5/131* (2013.01); *H03K 2005/00058* (2013.01)

(58) Field of Classification Search
None
See application file for complete search history.

(56) References Cited

U.S. PATENT DOCUMENTS

| | | | |
|---|---|---|---|
| 5,444,407 A | 8/1995 | Ganapathy et al. | |
| 5,790,841 A | 8/1998 | Scherer et al. | |
| 6,624,681 B1 | 9/2003 | Loyer et al. | |
| 7,043,670 B2 * | 5/2006 | Alani et al. | 714/47.1 |
| 7,475,374 B1 | 1/2009 | Johnson et al. | |
| 7,484,113 B1 * | 1/2009 | Plants et al. | 713/500 |
| 7,876,134 B2 * | 1/2011 | Jeong | G06F 7/68 327/113 |
| 2005/0140403 A1 * | 6/2005 | Lee | H03K 5/00006 327/122 |
| 2010/0156476 A1 * | 6/2010 | Obkircher | 327/119 |
| 2012/0326760 A1 * | 12/2012 | Kesselring et al. | 327/175 |

* cited by examiner

*Primary Examiner* — Lincoln Donovan
*Assistant Examiner* — Khareem E Almo
(74) *Attorney, Agent, or Firm* — Polansky & Associates, P.L.L.C.; Paul J. Polansky

(57) ABSTRACT

In one form, a clock doubler includes a switched inverter, an exclusive logic circuit, and a control signal generation circuit. The switched inverter has first and second control inputs for respectively receiving first and second control signals, a signal input for receiving a clock input signal, and an output. The exclusive logic circuit has a first input for receiving the clock input signal, a second input coupled to the output of the switched inverter, and an output for providing a clock output signal. A control signal generation circuit provides the first and second control signals in response to the clock output signal. The clock doubler may be used in a clock distribution circuit for an integrated circuit that also includes a phase locked loop for providing the input clock signals, and a plurality of clock sub-domains each having one of the clock doublers.

20 Claims, 5 Drawing Sheets

SELF-ADJUSTING CLOCK DOUBLER AND INTEGRATED CIRCUIT CLOCK DISTRIBUTION SYSTEM USING SAME

FIELD

This disclosure relates generally to clock circuits, and more specifically to clock circuits for uses such as integrated circuit clock trees.

BACKGROUND

Modern microprocessors are complex logic circuits that contain many millions of transistors integrated onto a small semiconductor chip. Microprocessors operate in synchronism with a clock signal. They typically include a phase locked loop (PLL) to increase the frequency of an input clock signal to higher operating frequencies. The higher frequency clock signal is distributed to various circuit blocks such as caches, instruction decoders, register files, arithmetic logic units, and the like in a hierarchy known as a "clock tree". The clock tree has a main trunk from the PLL, major branches that are routed in different directions on the chip, and sub-branches until the clock signals reach the actual circuitry. The clock tree typically re-buffers the clock signals at each branch and sub-branch.

Dynamic power in clocked complementary metal-oxide-semiconductor (CMOS) circuits is a function of the dynamic capacitance and both the frequency of operation and the square of the voltage, according to the formula $P=CV^2f$. The required voltage in turn is related to the frequency of operation; at faster speeds, higher voltages are required for proper operation. Conversely operation at lower speeds reduces power consumption by both reducing the frequency and reducing the required voltage.

Although modern, deep sub-micron CMOS semiconductor manufacturing technologies have allowed microprocessor chips to remain relatively small, the clock signals must be distributed widely around the chip. The signal lines that carry the clock signals have large capacitances because of the distances involved, and therefore they consume a significant portion of the chip's power budget. For example, the clock distribution network may account for about 10% or more of the overall chip power budget.

Because of the high power consumption of the clock tree, some engineers have devised clock trees whose PLLs output the main clock signal at half of the desired operating frequency. The clock tree distributes the half-speed clock signal through to save power. Then a set of local clock doublers increase the frequency of the half-speed clock signal at the branches or leaves of the tree back to the desired operating frequency. Unfortunately, known clock doublers have problems themselves, including high power consumption and the inability to provide a symmetrical 50% duty cycle. The drawbacks of known clock doublers have reduced the advantage of using this clock distribution technique.

Figure 1:
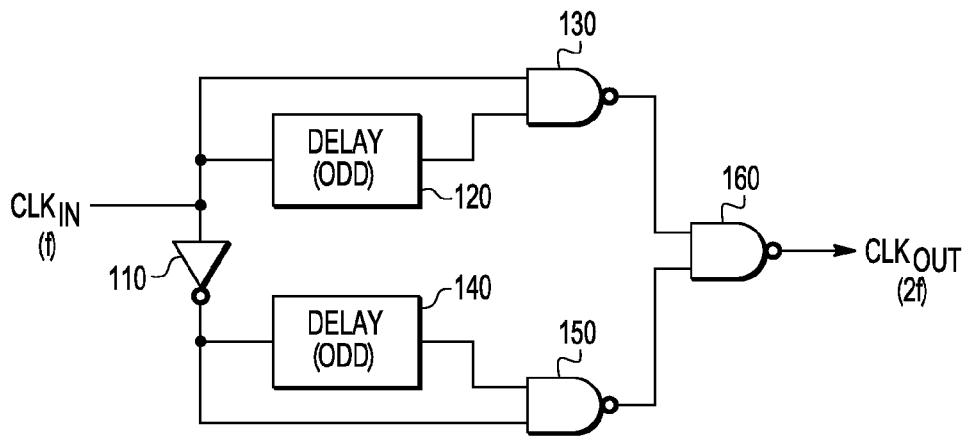
FIG. 1 illustrates in block diagram form a first clock doubler known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

In one form, a clock doubler includes a switched inverter, an exclusive logic circuit, and a control signal generation circuit. The switched inverter has first and second control inputs for respectively receiving first and second control signals, a signal input for receiving a clock input signal, and an output. The exclusive logic circuit has a first input for receiving the clock input signal, a second input coupled to the output of the switched inverter, and an output for providing a clock output signal. The control signal generation circuit provides the first and second control signals in response to the clock output signal.

In some embodiments, such a clock doubler may be used in a half-clock distribution system. The clock distribution system may include a phase locked loop having an input for receiving an external clock signal and an output for providing the clock input signal, and a plurality of clock sub-domains each receiving the clock input signal, in which each of the plurality of clock sub-domains comprise the clock doubler.

In other embodiments, the clock doubler can be used in different circuits and operate with low power consumption and small size.

In some embodiments, a clock input signal having a first frequency is received. The clock input signal is selectively inverted in response to a feedback signal to form a selectively inverted clock signal. The clock input signal is combined with the selectively inverted clock signal using an exclusive logic function to provide a clock output signal at a second frequency double the first frequency. The feedback signal is generated in response to the clock output signal.

FIG. 1 illustrates in block diagram form a first clock doubler 100 known in the prior art. Clock doubler 100 includes an inverter 110, a delay circuit 120, a NAND gate 130, a delay circuit 140, and a NAND gate 150, and an NAND gate 160. Inverter 110 has an input for receiving a clock input signal labeled "$CLK_{IN}$", and an output. Delay circuit 120 has an input for receiving the $CLK_{IN}$ signal, and an output. NAND gate 130 has a first input for receiving the $CLK_{IN}$ signal, a second input connected to the output of delay circuit 120, and an output. Delay circuit 140 has an input for receiving the $CLK_{IN}$ signal, and an output. NAND gate 140 has a first input connected to the output of delay circuit 140, a second input for receiving the $CLK_{IN}$ signal, and an output. NAND gate 150 has a first input connected to the output of NAND gate 130, a second input connected to the output of NAND gate 150, and an output for providing a clock output signal labeled "$CLK_{OUT}$".

Clock doubler 100 receives the $CLK_{IN}$ signal at a frequency f and converts it into the $CLK_{OUT}$ signal at a frequency of 2f. When $CLK_{IN}$ has been stable at a logic low, the first input of NAND gate 130 is a logic low, whereas the output of delay circuit 120, which includes an odd number of inverting stages, is a logic high. Thus the output of NAND gate 130 is at a logic high. Inverter 110 provides a logic high at its output, and delay circuit 140, which also includes an odd number of inverting stages, provides a logic low at its output, which causes NAND gate 150 to output a logic high. Since both inputs of NAND gate 160 are at a logic high, it outputs the $CLK_{OUT}$ signal at a logic low.

When $CLK_{IN}$ switches to a logic high, the inputs of NAND gate 130 are temporarily both at a logic high, and NAND gate 130 temporarily outputs a logic low. The logic low at the first input of NAND gate 160 causes its output to temporarily switch to a logic high. The output of delay circuit 140 begins at a logic low, keeping the output of NAND gate 150 at a logic high. When the logic high at the input of delay circuit 120 has propagated to the output as a logic low, the output of NAND gate 130 switches to a logic high. Meanwhile, output of delay circuit 140 is initially at a logic low. The logic low at the output of inverter 110 propagates to the output of delay circuit 140 as a logic high. However since the output of inverter 110 is a logic low, the output of NAND gate 150 remains at a logic high.

When $CLK_{IN}$ then switches to a logic low, the inputs of NAND gate 130 are temporarily both at a logic low, and NAND gate 130 outputs a logic high. The output of delay circuit 120 begins at a logic low, keeping the output of NAND gate 130 at a logic high. The logic low at the input of delay circuit 120 eventually propagates to the output as a logic high. Meanwhile, output of delay circuit 140 is initially at a logic high. The logic high at the output of inverter 110 causes NAND gate 150 to output a logic low, which causes NAND gate 160 to temporarily switch to a logic high. When the input of delay circuit 140 propagates to the output as a logic low, the output of NAND gate 150 switches to a logic high, causing the output of NAND gate 160 to switch to a logic low. Thus during each half phase of the $CLK_{IN}$ signal, the $CLK_{OUT}$ signal initially switches to a logic high before returning to a logic low, resulting in clock doubling.

However clock doubler 100 has at least two problems. First, the delay stages themselves consume significant amounts of power because the delay stages are made up of CMOS delay stages (such as CMOS inverters) that consume power every time they switch. For example, delay circuits 120 and 140 may each require 7 or 9 inverters to provide adequate delay. When combined with many other such clock doublers in a clock tree, the power savings gained from distributing the clock at half frequency are significantly offset by the increased power consumption caused by the operation of the clock doublers at the end of each branch.

Second, clock doubler 100 is typically required to drive a large load, which may reduce the logic high time and eventually cause failure of load circuits. Moreover, the load will vary throughout the integrated circuit, making it difficult to design a single clock doubler which is capable of adequately driving all loads without degradation of pulse-width and increased sensitivity to on-chip variation.

Figure 2:
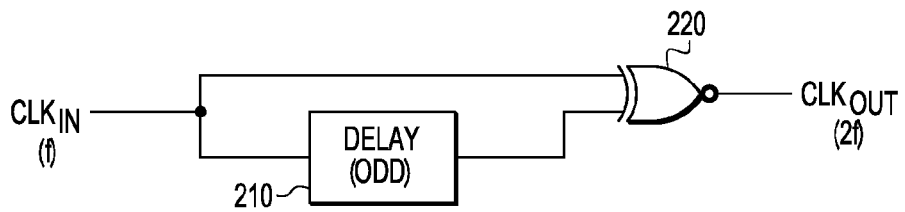
FIG. 2 illustrates in block diagram form a second clock doubler known in the prior art.

FIG. 2 illustrates in block diagram form a second clock doubler 200 known in the prior art. Clock doubler 200 includes a delay circuit 210 and an exclusive NOR gate 220. Delay circuit 210 has an input for receiving the $CLK_{IN}$ signal, and an output. Exclusive NOR gate 220 has a first input for receiving the $CLK_{IN}$ signal, a second input connected to the output of delay circuit 210, and an output for providing the $CLK_{OUT}$ signal.

Exclusive NOR gate 220 provides the $CLK_{OUT}$ signal at a logic high when both of its inputs are in the same logic state, and at a logic one when its inputs are in different logic states. Delay circuit 210 has an odd number of delay stages so that its output is in the opposite logic state as its input after the input has propagated to the output. Thus when $CLK_{IN}$ is initially in a logic low and switches to a logic high, the inputs to exclusive NOR gate 220 are initially in the same logic state (logic high), and the output of exclusive NOR gate 220 is initially at a logic low. When the logic high at the input of delay circuit 210 propagates to a logic low at the output, then the inputs to exclusive NOR gate 220 are different and exclusive NOR gate 220 outputs a logic low. When $CLK_{IN}$ switches to a logic low, the inputs to exclusive NOR gate 220 are initially in the same logic state (logic low), and the output of exclusive NOR gate 220 is initially at a logic high. When the logic low at the input of delay circuit 210 propagates to a logic high at the output, then the inputs to exclusive NOR gate 220 are different and exclusive NOR gate 220 outputs a logic low. Thus during each half phase of the $CLK_{IN}$ signal, the $CLK_{OUT}$ signal initially switches to a logic high before returning to a logic low, resulting in clock doubling.

While clock doubler 200 has reduced area and power compared to clock doubler 100 of FIG. 1, the number of inverting delay stages will be about the same. Thus clock doubler 200 continues to consume a significant amount of area and power.

Figure 3:
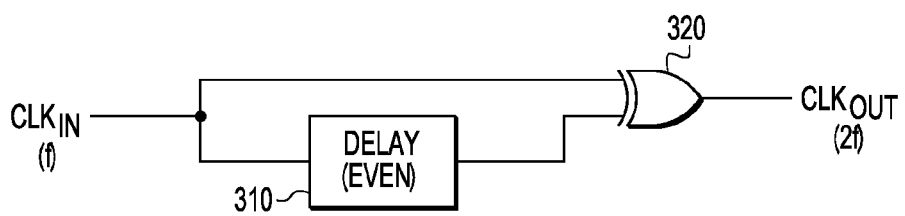
FIG. 3 illustrates in block diagram form a third clock doubler known in the prior art.

FIG. 3 illustrates in block diagram form a third clock doubler 300 known in the prior art. Clock doubler 300 includes a delay circuit 310 and an exclusive OR gate 320. Delay circuit 310 has an input for receiving the $CLK_{IN}$ signal, and an output. Exclusive OR gate 320 has a first input for receiving the $CLK_{IN}$ signal, a second input connected to the output of delay circuit 310, and an output for providing the $CLK_{OUT}$ signal.

Exclusive OR gate 320 provides the $CLK_{OUT}$ signal at a logic high when its inputs are in different logic states, and at a logic low when its inputs are in the same logic state. Delay circuit 310 has an even number of delay stages so that its output is in the same logic state as its input after the input has propagated to the output. Thus when $CLK_{IN}$ is initially in a logic low and switches to a logic high, the inputs to exclusive OR gate 320 are initially in different logic states, and the output of exclusive OR gate 320 is initially at a logic high. When the logic high at the input of delay circuit 310 propagates to a logic high at the output, then the inputs to exclusive OR gate 320 are in the same state and exclusive OR gate 320 outputs a logic low. When $CLK_{IN}$ switches to a logic low, the inputs to exclusive NOR gate 320 are initially in different logic states, and the output of exclusive OR gate 320 is initially at a logic high. When the logic low at the input of delay circuit 310 propagates to a logic low at the output, then the inputs to exclusive OR gate 320 are the same and exclusive OR gate 320 outputs a logic low. Thus during each half phase of the $CLK_{IN}$ signal, the $CLK_{OUT}$ signal initially switches to a logic high before returning to a logic low, resulting in clock doubling.

Clock doubler 300 is the analog of clock doubler 200 of FIG. 2 for exclusive OR logic. While clock doubler 300 also has reduced area and power compared to clock doubler 100 of FIG. 1, the number of inverting delay stages will be about the same. Thus clock doubler 300 (like clock doubler 200) also consumes a significant amount of area and power.

Figure 4:
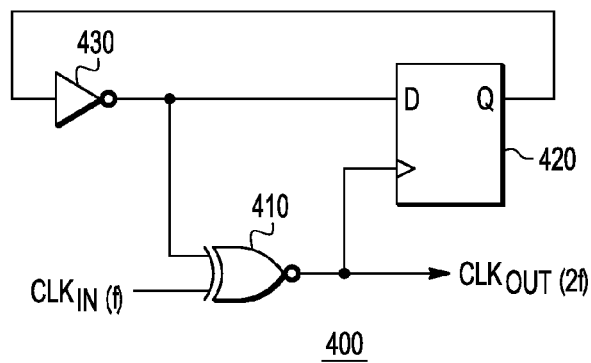
FIG. 4 illustrates in block diagram form a fourth clock doubler known in the prior art.

FIG. 4 illustrates in block diagram form a fourth clock doubler 400 known in the prior art. Clock doubler 400 includes an exclusive NOR gate 410, a D-type flip flop 420, and an inverter 430. Exclusive NOR gate 410 has a first input, a second input for receiving the $CLK_{IN}$ signal, and an output for providing the $CLK_{OUT}$ signal. D-type flip flop has a D input, a clock input connected to the output of exclusive NOR gate 410, and a Q output. Inverter 430 has an input connected to the Q output of D-type flip flop 420, and an output connected to the first input of exclusive NOR gate 410 and to the D input of D-type flip flop 420.

Since clock doubler 400 uses D-type flip-flop 420, it consumes extra power compared to NAND gates 130, 150 and 160 of clock doubler 100, exclusive NOR gate 220 of clock doubler 200, and exclusive OR gate 320 of clock doubler 300. However it also uses the clock-to-Q delay of D-type flip flop 420 as part of the delay chain, saving area and power in the respective delay chains. However the clock-to-Q delay of flip-flop 420 sets a lower limit on the delay time of the $CLK_{OUT}$ pulse, potentially providing a wider pulse than necessary when used to directly control register elements like flip-flops and latches.

Figure 5:
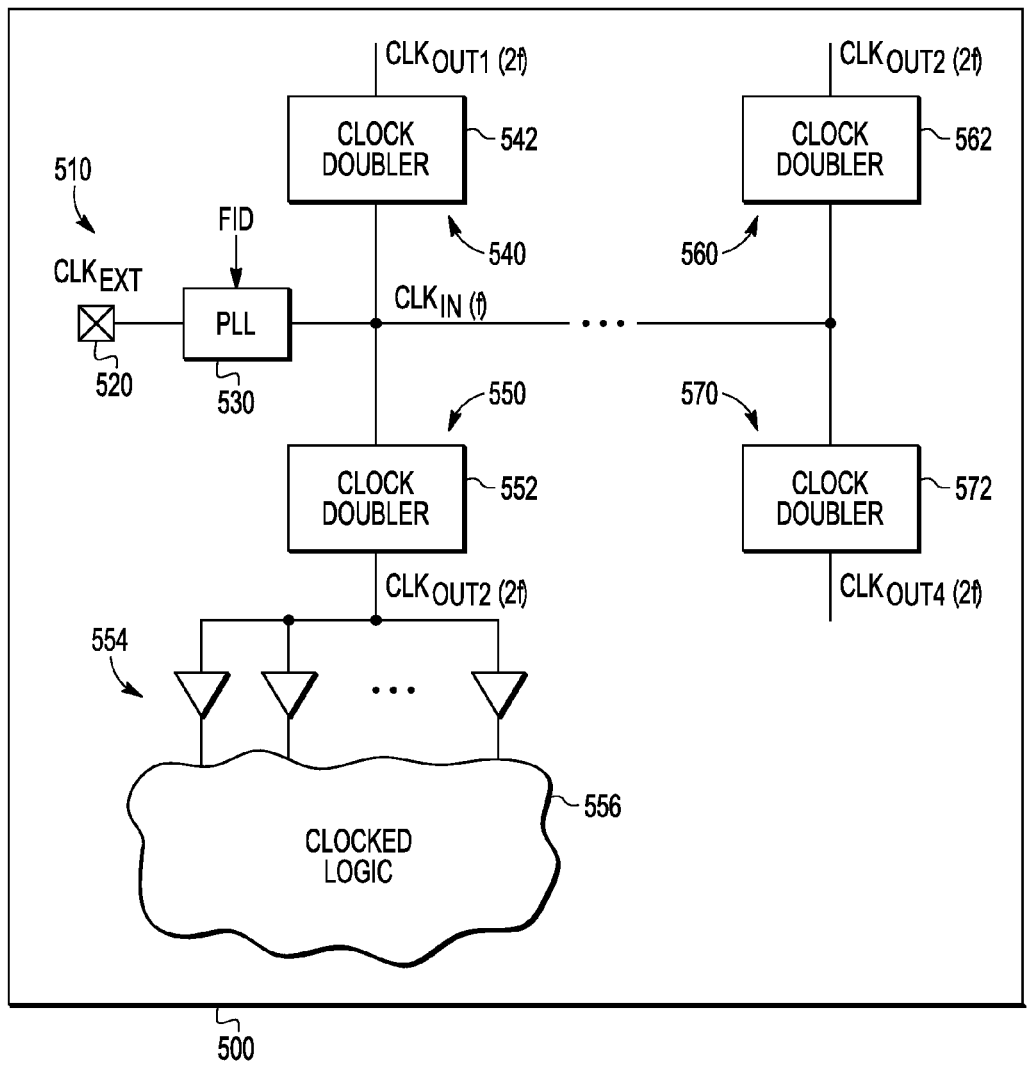
FIG. 5 illustrates in block diagram form an integrated circuit with a clock distribution system according to some embodiments.

FIG. 5 illustrates in block diagram form an integrated circuit 500 with a clock distribution system 510 according to some embodiments. Clock distribution system 510 includes a bonding pad 520, a PLL 530, and a set of clock sub-domains 540, 550, 560, and 570. Bonding pad 520 receives an external clock signal labeled "$CLK_{EXT}$". PLL 530 has an input connected to bonding pad 520, a control input for receiving a signal labeled "FID", and an output for providing the $CLK_{IN}$ signal. Clock distribution system 510 includes a number of clock sub-domains, of which a representative set of clock sub-domains 540, 550, 560, and 570 are shown in FIG. 5. Each clock sub-domain has a clock doubler having an input for receiving the $CLK_{IN}$ signal, and an output for providing a respective $CLK_{OUT}$ signal. Clock sub-domain 540 includes a clock doubler 542 having an input for receiving the $CLK_{IN}$ signal, and an output for providing a signal labeled "$CLK_{OUT2}$" for use in a further distribution to circuits in its clock sub-domain. Clock sub-domains 550, 560, and 570 each include clock doublers 552, 562, and 572, respectively, having inputs for receiving the $CLK_{IN}$ signal, and outputs for providing signals labeled "$CLK_{OUT2}$", "$CLK_{OUT3}$", and "$CLK_{OUT4}$", respectively.

FIG. 5 illustrates further details of an exemplary clock sub-domain 550. Connected to the output of clock doubler 552 is a set of clock buffers 554 each providing buffered $CLK_{OUT2}$ signals to different portions of a clocked logic circuit 556. Note that integrated circuit 500 may be a microprocessor or other clocked logic circuit that utilizes a clock tree with half-clock distribution to various clock sub-domains. Moreover, integrated circuit 500 may include other clock domains besides the domain associated with clock distribution system 510. For example as shown in FIG. 5, PLL 530 receives control signal FID which represents a frequency identification signal that allows the frequency of which the clock domain operates to vary. This is useful in multi-core microprocessors that allow each processor core to operates in a different power state (P-state), wherein each P-state is defined by a different frequency (indicated by FID) and voltage, and which control the P-state of each core to correspond to the processing workload.

Figure 6:
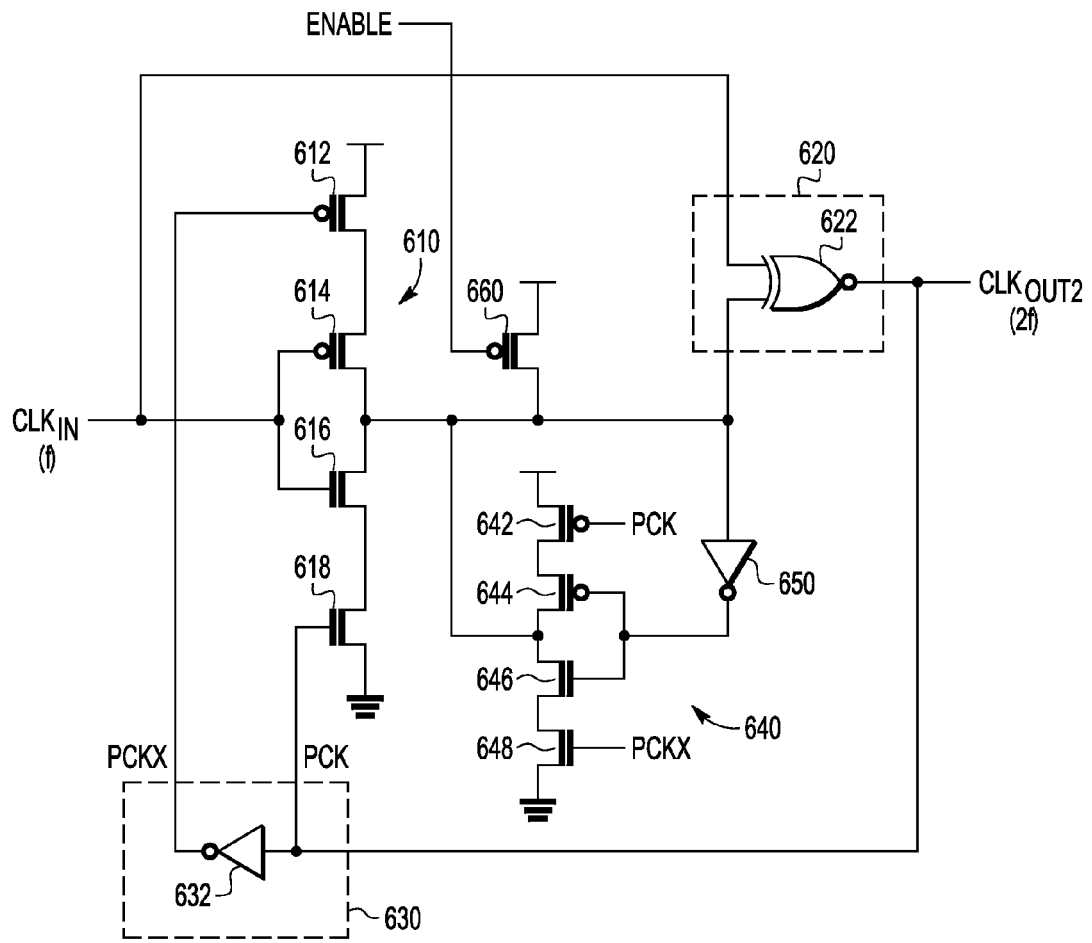
FIG. 6 illustrates in partial block diagram and partial schematic form a clock doubler suitable for use in the clock distribution system of FIG. 5 according to some embodiments.

FIG. 6 illustrates in partial block diagram and partial schematic form a clock doubler 600 suitable for use in clock distribution system 510 of FIG. 5 according to some embodiments. Clock doubler 600 includes generally a switched inverter 610, an exclusive logic circuit 620, a control signal generation circuit 630, a latch that in one embodiment is formed by the combination of a switched inverter 640 and an inverter 650, and a P-channel MOS transistor 660. Switched inverter 610 includes P-channel MOS transistors 612 and 614 and N-channel MOS transistors 616 and 618. Transistor 612 has a source connected to a power supply voltage terminal labeled "$V_{DD}$", a gate for receiving a signal labeled "PCKX", and a drain. Transistor 614 has a source connected to the drain of transistor 612, a gate for receiving the $CLK_{IN}$ signal, and a drain. Transistor 616 has a drain connected to the drain of transistor 614, a gate for receiving the $CLK_{IN}$ signal, and a source. Transistor 618 has a drain connected to the source of transistor 616, a gate for receiving a signal labeled "PCK", and a source connected to ground. $V_{DD}$ is a more-positive power supply voltage terminal having a nominal voltage of, for example, 1.2 volts with respect to ground.

Exclusive logic circuit 620 includes an exclusive NOR gate 622. Exclusive NOR gate 622 includes a first input for receiving the $CLK_{IN}$ signal, a second input connected to the drains of transistors 614 and 616, and an output for providing the $CLK_{OUT2}$ signal.

Control signal generation circuit 630 includes an inverter 632. Inverter 632 has an input connected to the output of exclusive NOR gate 622 that is also connected to the gate of transistor 518 for providing the PCK signal, and an output connected to the gate of transistor 612 for providing the PCKX signal.

In the embodiment of the latch shown in FIG. 6, switched inverter 640 includes P-channel MOS transistors 642 and 644, and N-channel MOS transistors 646 and 648. Transistor 642 has a source connected to $V_{DD}$, a gate for receiving signal PCK, and a drain. Transistor 644 has a source connected to the drain of transistor 642, a gate, and a drain connected to the second input of exclusive NOR gate 622. Transistor 646 has a drain connected to the drain of transistor 644, a gate, and a source. Transistor 648 has a drain connected to the source of transistor 646, a gate for receiving the PCKX signal, and a source connected to ground.

Inverter 650 has an input connected to the drains of transistors 614, 616, 644, and 646, and an output connected to the gates of transistors 644 and 646. Transistor 660 has a source connected to $V_{DD}$, a gate for receiving a signal labeled "ENABLE", and a drain connected to the second input terminal of exclusive NOR gate 622.

When clock doubler 600 is gated off, a controller (not shown) de-activates the ENABLE signal at a logic low. Transistor 660 is conductive, forcing a logic high on the second input of exclusive NOR gate 622. The controller also keeps the $CLK_{IN}$ signal at a logic low, thus holding the output of the exclusive NOR gate 622 at a logic low. Control signal generation circuit 630 generates PCK at a logic low and PCKX at a logic high, causing switched inverter 640 with inverter 650 to latch and reinforce the logic high on the second input of exclusive NOR gate 622, while keeping switched inverter 610 inactive.

When clock doubler 600 is gated on, the controller activates the ENABLE signal at a logic high. Transistor 660 becomes non-conductive, but since switched inverter 610 is still inactive, the logic high on the second input of exclusive NOR gate 622 remains. The $CLK_{IN}$ signal begins to toggle as a free-running clock at frequency f. The first rising edge of $CLK_{IN}$ places a logic high on the first input of exclusive NOR gate 622, causing exclusive NOR gate 622 TO PROVIDE THE $CLK_{OUT2}$ SIGNAL AT A LOGIC HIGH. THE LOGIC HIGH ON $CLK_{OUT2}$ causes control signal generation circuit 630 to provide signal PCK at a logic high and signal PCKX at a logic low. These control signals activate switched inverter 610 and deactivates switched inverter 640. Switched inverter 610 then provides a logic low on its output and the second input of exclusive NOR gate 622. Since the inputs are now different, the output of exclusive NOR gate 622 switches to a logic low. The logic low in turn causes control signal generation circuit 630 to generate signal PCK at a logic low and signal PCKX at a logic high, disabling switched inverter 610 and enabling switched inverter 640. Switched inverter 640 with inverter 650 latches and reinforces the logic low at its output.

When $CLK_{IN}$ switches to a logic low, the output of exclusive NOR gate 622 is again momentarily a logic high since its inputs are both in the same logic state (logic low). The high voltage on the $CLK_{OUT2}$ signal causes control signal generation circuit 630 to generate signal PCK at a logic high and signal PCKX at a logic low. Thus control signal generation circuit 630 enables switched inverter 610 and disables switched inverter 640. Switched inverter 610 then provides a logic high on the second input of exclusive NOR gate 622, causing its output to switch low.

This operation continues for every rising and falling edge of the $CLK_{IN}$ signal and causes clock doubler 600 to generate the $CLK_{OUT2}$ signal at twice the frequency of the $CLK_{IN}$ signal. Since an active high pulse is generated for every transition of $CLK_{IN}$, clock doubler 600 provides $CLK_{OUT2}$ at twice the frequency of $CLK_{IN}$. The width of the high pulse is set by the delay through control signal generation circuit 630, switched inverter 610, and exclusive NOR gate 622.

Clock doubler 600 does not require a significant number of delay stages because exclusive NOR gate 622 is actually part of the delay stage. The feedback path from the $CLK_{OUT2}$ signal propagates through exclusive NOR gate 622, which approximates the delay stages of clock doublers 100, 200, and 300. The delay through an exclusive NOR gate is two to three times that of a simple CMOS inverter, and thus the area and power is much smaller than for any of clock doublers 100, 200, 300, and 400.

Clock doubler 600 is also adaptive/self adjusting. Since the $CLK_{OUT2}$ signal will be heavily loaded to drive multiple latches or registers or, as is shown in FIG. 5, multiple clock buffers 452, the delay contribution of the load is fed back through control signal generation circuit 630 so it can adjust its pulse width based on the load.

In additional embodiments described below, various modifications can be made to clock doubler 600 to improve or enhance certain characteristics. These modifications include using a different exclusive logic circuit, more precisely controlling the duty cycle, and supporting clock gating, and can be used alone or in combination with other features and modifications. These modifications will now be described.

Figure 7:
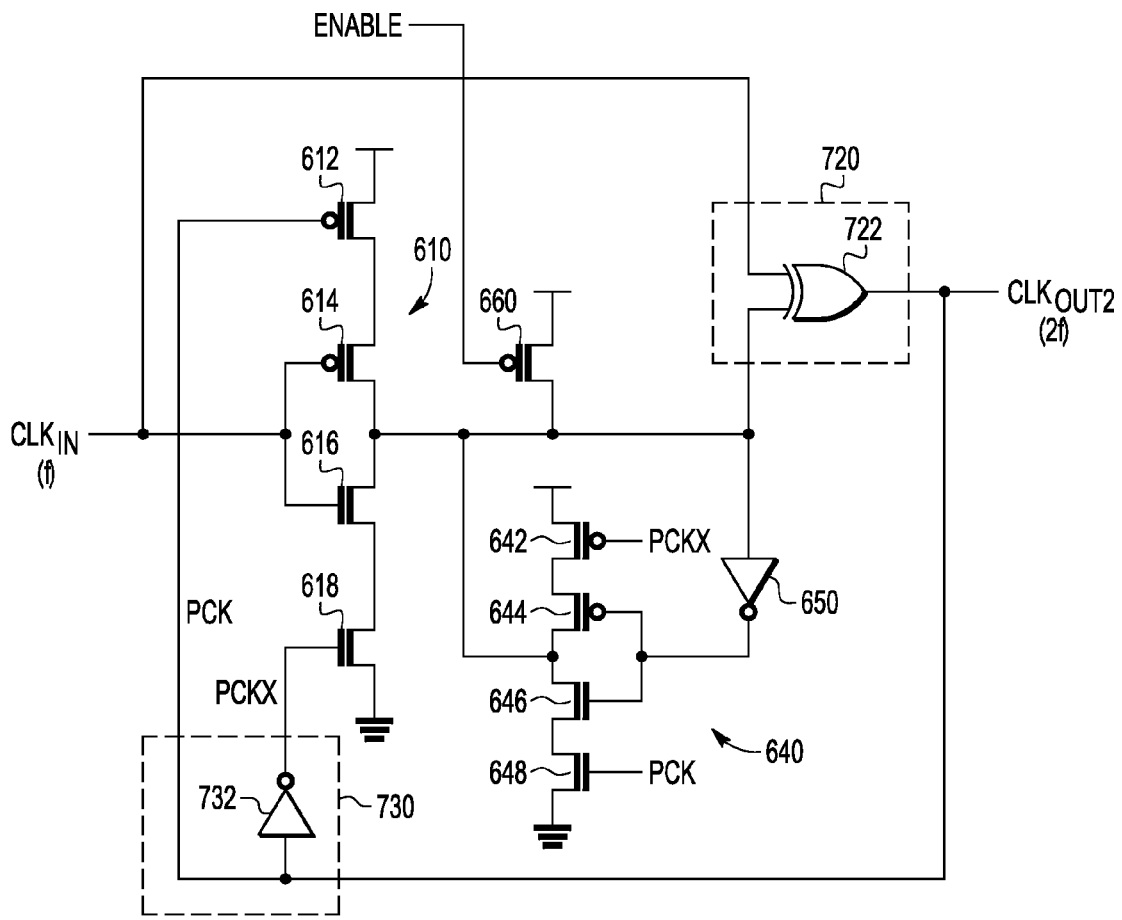
FIG. 7 illustrates in partial block diagram and partial schematic form another clock doubler suitable for use in the clock distribution system of FIG. 5 according to some embodiments.

FIG. 7 illustrates in partial block diagram and partial schematic form another clock doubler 700 suitable for use in clock distribution system 510 of FIG. 5 according to some embodiments. Clock doubler 700 is the same as clock doubler 600 of FIG. 6 except that exclusive logic circuit 720 includes an exclusive OR gate 722 instead of exclusive NOR gate 622, and control signal generation circuit 730 generates signal PCKX from the output of an inverter 732, and signal PCK to be the same as the $CLK_{OUT2}$ signal. Note also that in switched inverter 640, transistor 642 receives signal PCKX, and transistor 648 receives signal PCK.

Figure 8:
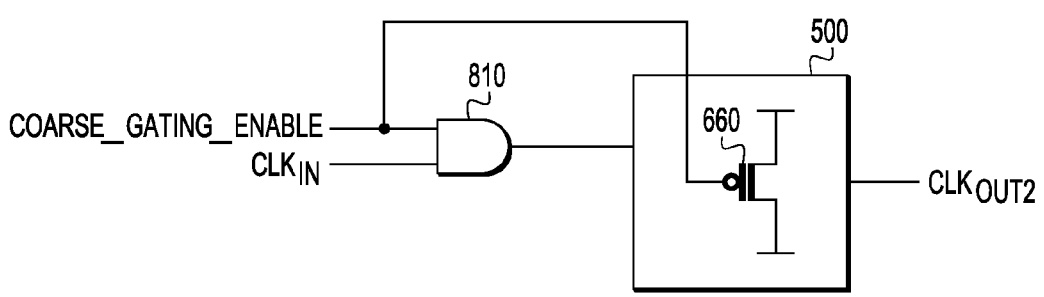
FIG. 8 illustrates in partial block diagram and partial schematic form yet another clock doubler suitable for use in the clock distribution system of FIG. 5 according to some embodiments.

FIG. 8 illustrates in partial block diagram and partial schematic form still another clock doubler 800 suitable for use in clock distribution system 510 of FIG. 5 according to some embodiments. Clock doubler 800 is the same as clock doubler 600 of FIG. 6 except that it uses a control signal labeled "COARSE_GATING_ENABLE" to provide not only the ENABLE signal to transistor 660, but also to gate the $CLK_{IN}$ signal off. For this purpose, clock doubler 800 includes an additional AND gate having a first input for receiving the COARSE_GATING_ENABLE signal, a second input for receiving the CLKIN signal, and an output for providing a gated clock signal. As shown in FIG. 8 and described above, when COARSE_GATING_ENABLE is low, the output of AND gate 810 is also low, and the output of exclusive NOR gate 622 is pulled to a logic high to initialize it.

Figure 9:
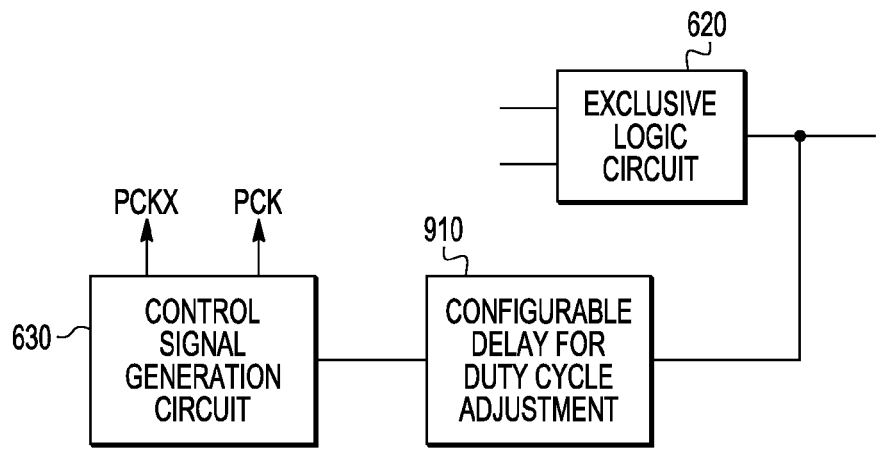
FIG. 9 illustrates in partial block diagram and partial schematic form still another clock doubler suitable for use in the clock distribution system of FIG. 5 according to some embodiments.

FIG. 9 illustrates in partial block diagram and partial schematic form yet another clock doubler 900 suitable for use in clock distribution system 510 of FIG. 5 according to some embodiments. Clock doubler 900 is the same as clock doubler 600 of FIG. 6 except that it adds a configurable delay circuit 910 between the output of exclusive logic circuit 620 and control signal generation circuit 630. Configurable delay circuit 910 allows the user to trade off area and power for better control of the width of the logic high pulse.

Figure 10:
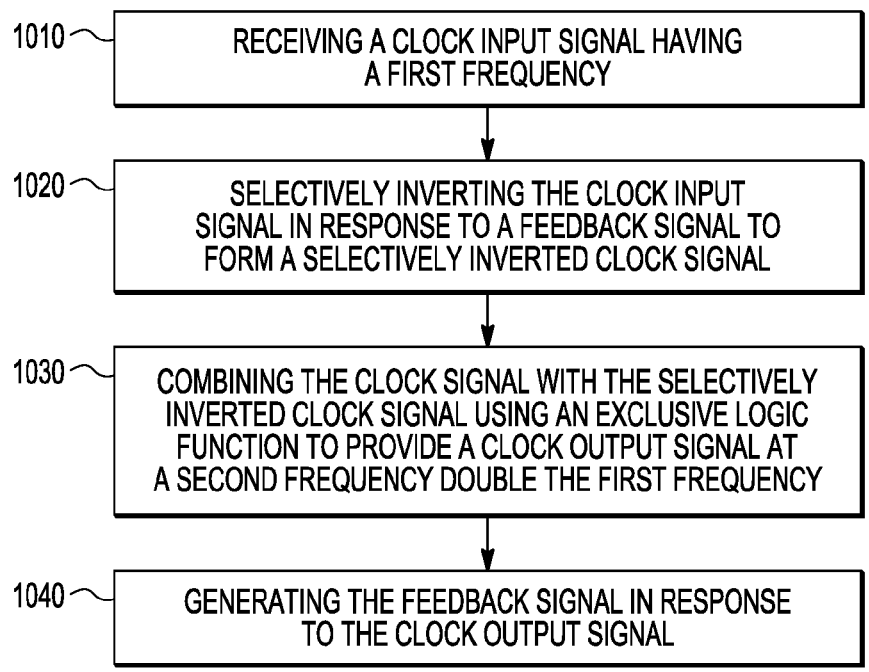
FIG. 10 illustrates a flow diagram of a method of doubling a clock signal according to some embodiments.

FIG. 10 illustrates a flow diagram of a method 1000 of doubling a clock signal according to some embodiments. Action box 1010 includes a step of receiving a clock input signal having a first frequency. Action box 1020 includes selectively inverting the clock input signal in response to a feedback signal to form a selectively inverted clock signal. Action box 1030 includes combining the clock signal with the selectively inverted clock signal using an exclusive logic function to provide a clock output signal at a second frequency double the first frequency. Action box 1040 includes generating the feedback signal in response to the clock output signal.

The circuits of FIGS. 5-9 or portions thereof may be described or represented by a computer accessible data structure in the form of a database or other data structure which can be read by a program and used, directly or indirectly, to fabricate integrated circuits with the circuits of FIGS. 5-9. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits with the circuits of FIGS. 5-9. The netlist may then be placed and routed to produce a data set describing geometric shapes to be applied to masks. The masks may then be used in various semiconductor fabrication steps to produce integrated circuits of FIGS. 5-9. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, a clock doubler circuit as described herein is suitable for a variety of applications, including microprocessors, other large clocked logic circuits, programmable gate arrays, and the like. Moreover various features or enhancements can be used in various combinations to achieve a desired clock characteristics with acceptable power and circuit area tradeoffs.

Accordingly, it is intended by the appended claims to cover all modifications of the disclosed embodiments that fall within the scope of the disclosed embodiments.

What is claimed is:

1. A clock doubler comprising:
   a switched inverter having first and second control inputs for respectively receiving first and second control signals, a signal input for receiving a clock input signal having a first frequency, and an output for providing a selectively inverted clock signal in response to said first and second control signals;
   an exclusive logic circuit having a first input for receiving said clock input signal, a second input coupled to said output of said switched inverter for receiving said selectively inverted clock signal, and an output for providing a clock output signal at a second frequency double said first frequency; and
   a control signal generation circuit for providing said first and second control signals in response to said clock output signal.

2. The clock doubler of claim 1 wherein said switched inverter comprises:
   a first transistor of a first conductivity type having a first current electrode coupled to a first power supply voltage terminal, a control electrode for receiving said first control signal, and a second current electrode;
   a second transistor of said first conductivity type having a first current electrode coupled to said second current electrode of said first transistor, a control electrode for receiving said clock input signal, and a second current electrode coupled to said second input of said exclusive logic circuit;
   a third transistor of a second conductivity type having a first current electrode coupled to said second current electrode of said second transistor, a control electrode for receiving said clock input signal, and a second current electrode; and
   a fourth transistor of said second conductivity type having a first current electrode coupled to said second current electrode of said third transistor, a control electrode for receiving said second signal, and a second current electrode coupled to a second power supply voltage terminal.

3. The clock doubler of claim 2, wherein said first power supply voltage terminal is more positive with respect to said second power supply voltage terminal, said first and second transistors are P-channel MOS transistors, and said third and fourth transistors are N-channel MOS transistors.

4. The clock doubler of claim 1, further comprising:
   a clock gating circuit having a first input for receiving a clock gating enable signal, a second input for receiving said clock input signal, and an output coupled to said clock input signal of said switched inverter.

5. The clock doubler of claim 4, further comprising:
   a fifth transistor having a first current electrode coupled to a first power supply voltage terminal, a control electrode for receiving said clock gating enable signal, and a second current electrode coupled to said second input of said exclusive logic circuit.

6. The clock doubler of claim 1, further comprising:
   a latch coupled to said output of said switched inverter and responsive to said first and second control signals to latch a value on said output of said switched inverter.

7. The clock doubler of claim 1, wherein said exclusive logic circuit comprises an exclusive NOR gate, and said control signal generation circuit provides said first control signal corresponding to a complement of said clock output signal, and said second control signal corresponding to said clock output signal.

8. The clock doubler of claim 1, wherein said exclusive logic circuit comprises an exclusive OR gate, and said control signal generation circuit provides said first control signal corresponding to said clock output signal, and said second control signal corresponding to a complement of said clock output signal.

9. The clock doubler of claim 1 further comprising:
   a configurable delay circuit coupled between said output of said exclusive logic circuit and said input of said control signal generation circuit.

10. A clock distribution system for an integrated circuit comprising:
    a phase locked loop having an input for receiving an external clock signal, and an output for providing a clock input signal;
    a plurality of clock sub-domains each receiving said clock input signal, wherein each of said plurality of clock sub-domains comprise a clock doubler having an input for receiving said clock input signal, and an output for providing a clock output signal, each clock doubler comprising:
      a switched inverter having first and second control inputs for respectively receiving first and second control signals, a signal input for receiving said clock input signal, and an output;
      an exclusive logic circuit having an first input for receiving said clock input signal, a second input coupled to said output of said switched inverter, and an output for providing said clock output signal; and
      a control signal generation circuit for providing said first and second control signals in response to said clock output signal.

11. The clock distribution system of claim 10 wherein said switched inverter comprises:
    a first transistor of a first conductivity type having a first current electrode coupled to a first power supply voltage terminal, a control electrode for receiving said first control signal, and a second current electrode;
    a second transistor of said first conductivity type having a first current electrode coupled to said second current electrode of said first transistor, a control electrode for receiving said clock input signal, and a second current electrode coupled to said second input of said exclusive logic circuit;
    a third transistor of a second conductivity type having a first current electrode coupled to said second current electrode of said second transistor, a control electrode for receiving said clock input signal, and a second current electrode; and
    a fourth transistor of said second conductivity type having a first current electrode coupled to said second current electrode of said third transistor, a control electrode for receiving said second signal, and a second current electrode coupled to a second power supply voltage terminal.

12. The clock distribution system of claim 10, wherein said clock doubler further comprises:
    a clock gating circuit having a first input for receiving a clock gating enable signal, a second input for receiving said clock input signal, and an output coupled to said signal input of said switched inverter.

13. The clock distribution system of claim 12, wherein said clock doubler further comprises:
 a fifth transistor having a first current electrode coupled to a first power supply voltage terminal, a control electrode for receiving said clock gating enable signal, and a second current electrode coupled to said second input of said exclusive logic circuit.

14. The clock distribution system of claim 10, wherein said clock doubler further comprises:
 a latch coupled to said output of said switched inverter and responsive to said first and second control signals to latch a value on said output of said switched inverter.

15. The clock distribution system of claim 10, wherein each of said plurality of clock sub-domains further comprises:
 a plurality of clock buffers each having an input for receiving said clock output signal, and an output for providing a corresponding one of a plurality of buffered clock signals; and
 a clocked logic circuit having inputs coupled to said output of each of said plurality of clock buffers, and operating in response to said plurality of buffered clock signals.

16. The clock distribution system of claim 10, wherein said clock doubler further comprises:
 a configurable delay circuit coupled between said output of said exclusive logic circuit and said input of said control signal generation circuit.

17. A method comprising:
 receiving a clock input signal having a first frequency;
 selectively inverting said clock input signal in response to a feedback signal to form a selectively inverted clock signal;
 combining said clock signal with said selectively inverted clock signal using an exclusive logic function to provide a clock output signal at a second frequency double said first frequency; and
 generating said feedback signal in response to said clock output signal.

18. The method of claim 17 further comprising:
selectively latching said selectively inverted clock signal in response to a complement of said feedback signal.

19. The method of claim 17 wherein:
 said combining comprises combining said clock signal with said selectively inverted clock signal using an exclusive NOR logic function to provide said clock output signal; and
 said selectively inverting comprises selectively inverting said clock signal in response to a complement of said clock output signal.

20. The method of claim 17 wherein:
 said combining comprises combining said clock signal with said selectively inverted clock signal using an exclusive OR logic function to provide said clock output signal; and
 said selectively inverting comprises selectively inverting said clock signal in response to said clock output signal.

* * * * *